(12) United States Patent  (10) Patent No.: US 7,975,250 B2
Honary et al.  (45) Date of Patent: Jul. 5, 2011

(54) ALLOCATION OF COMBINED OR SEPARATE DATA AND CONTROL PLANES

(75) Inventors: Hooman Honary, Newport Coast, CA (US); Inching Chen, Portland, OR (US); Ernest T. Tsui, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 324 days.

(21) Appl. No.: 12/186,622

(22) Filed: Aug. 6, 2008

(65) Prior Publication Data

US 2008/0294874 A1 Nov. 27, 2008

Related U.S. Application Data

(62) Division of application No. 10/789,187, filed on Feb. 27, 2004, now Pat. No. 7,424,698.

(51) Int. Cl.
G06F 17/50 (2006.01)
(52) U.S. Cl. ........................ 716/116; 716/100; 716/117
(58) Field of Classification Search ................ 716/1, 17, 716/100, 116, 117
See application file for complete search history.

(56) References Cited

U.S. PATENT DOCUMENTS

| | | | |
|---|---|---|---|
| 5,128,871 A | 7/1992 | Schmitz | |
| 5,848,096 A | 12/1998 | Shou et al. | |
| 5,987,490 A | 11/1999 | Alidina et al. | |
| 6,029,212 A * | 2/2000 | Kessler et al. | 710/52 |
| 6,038,386 A | 3/2000 | Jain | |
| 6,112,023 A | 8/2000 | Dave et al. | |
| 6,195,788 B1 | 2/2001 | Leaver et al. | |
| 6,226,735 B1 | 5/2001 | Mirsky | |
| 6,237,054 B1 | 5/2001 | Freitag, Jr. | |
| 6,260,055 B1 | 7/2001 | Sugeno et al. | |
| 6,266,797 B1 | 7/2001 | Godfrey et al. | |
| 6,272,188 B1 | 8/2001 | Mobin et al. | |
| 6,281,703 B1 | 8/2001 | Furuta et al. | |
| 6,298,319 B1 | 10/2001 | Heile et al. | |
| 6,397,240 B1 | 5/2002 | Fernando et al. | |
| 6,483,838 B1 | 11/2002 | Ostman et al. | |
| 6,665,725 B1 | 12/2003 | Dietz et al. | |
| 6,738,891 B2 | 5/2004 | Fujii et al. | |
| 6,771,094 B1 | 8/2004 | Langhammer | |
| 6,820,102 B2 | 11/2004 | Aldrich et al. | |
| 6,839,751 B1 | 1/2005 | Dietz et al. | |
| 6,915,502 B2 | 7/2005 | Schott et al. | |
| 6,941,538 B2 | 9/2005 | Hwang et al. | |
| 6,973,135 B1 | 12/2005 | Leyonhjelm et al. | |

(Continued)

FOREIGN PATENT DOCUMENTS

EP 1311073 A1 5/2003

(Continued)

OTHER PUBLICATIONS

Final Office Action from Corresponding Japan application P2006-554116, filed Feb. 27, 2004. Office Action Issued Jan. 25, 2010.

(Continued)

*Primary Examiner* — Vuthe Siek
*Assistant Examiner* — Magid Y Dimyan
(74) *Attorney, Agent, or Firm* — Cool Patent, P.C.; Joseph P. Curtin

(57) ABSTRACT

A dual mesh interconnect network in a heterogeneous configurable circuit may be allocated between data communication and control communication.

12 Claims, 4 Drawing Sheets

U.S. PATENT DOCUMENTS

| | | | |
|---|---|---|---|
| 7,039,919 B1 | 5/2006 | Hunt | |
| 7,072,382 B2 | 7/2006 | Dent | |
| 7,073,159 B2 | 7/2006 | Tsai et al. | |
| 7,119,576 B1 | 10/2006 | Langhammer et al. | |
| 7,200,837 B2 | 4/2007 | Stevens | |
| 7,424,698 B2 | 9/2008 | Honary et al. | |
| 2001/0018733 A1* | 8/2001 | Fujii et al. | 712/16 |
| 2002/0073380 A1 | 6/2002 | Cooke et al. | |
| 2003/0105799 A1 | 6/2003 | Khan et al. | |
| 2004/0006584 A1 | 1/2004 | Vandeweerd | |
| 2004/0090964 A1 | 5/2004 | Reed et al. | |
| 2004/0095907 A1 | 5/2004 | Agee et al. | |
| 2004/0107332 A1* | 6/2004 | Fujii et al. | 712/16 |
| 2004/0153625 A1* | 8/2004 | Fujii et al. | 712/13 |
| 2004/0172476 A1 | 9/2004 | Chapweske | |
| 2004/0187088 A1 | 9/2004 | Cambonie | |
| 2004/0194048 A1 | 9/2004 | Arnold | |
| 2004/0250046 A1 | 12/2004 | Gonzalez et al. | |
| 2004/0258069 A1 | 12/2004 | Serbest et al. | |
| 2005/0021578 A1 | 1/2005 | Chen | |
| 2005/0025222 A1 | 2/2005 | Underbrink et al. | |
| 2005/0044195 A1* | 2/2005 | Westfall | 709/223 |
| 2005/0138323 A1 | 6/2005 | Snyder | |
| 2005/0149890 A1 | 7/2005 | Tsai et al. | |
| 2005/0187998 A1 | 8/2005 | Zheng et al. | |
| 2005/0193357 A1 | 9/2005 | Honary et al. | |
| 2005/0203988 A1 | 9/2005 | Nollet et al. | |
| 2005/0223110 A1 | 10/2005 | Honary et al. | |
| 2005/0229139 A1 | 10/2005 | Tsai et al. | |
| 2005/0229140 A1 | 10/2005 | Tsai et al. | |

FOREIGN PATENT DOCUMENTS

| | | |
|---|---|---|
| EP | 1315335 A1 | 5/2003 |
| JP | 2000224025 | 8/2000 |
| JP | 2001312481 | 11/2001 |
| JP | 2003-244249 | 8/2003 |
| WO | WO-0038087 A1 | 6/2000 |
| WO | WO-2005094016 A2 | 10/2005 |
| WO | WO-2005094016 A3 | 10/2005 |
| WO | WO-2005098649 A2 | 10/2005 |
| WO | WO-2005098649 A3 | 10/2005 |
| WO | WO-2005098685 A2 | 10/2005 |
| WO | WO-2005098685 A3 | 10/2005 |

OTHER PUBLICATIONS

Tsui, E. et al., "A New Distributed DSP Architechture Based on the Intel IXS for Wireless Client and Infrastructure", *Hot chips 14, Conf. record Session 7:digital signal processors*, Aug. 20, 2002, 1-17.

Compton, K. H., "Reconfigurable Computing: A Survey of Systems and Software", *ACM Computing Surveys*, 34(2), (Jun. 2002),171-210.

Lettieri, P. et al., "Adaptive Frame Length Control for Improving Wireless Link Throughput Range, and Energy Efficiency", *Infocom '98, 17th annual joint conf.of the IEEE Computer & communicationss societies*, 2, (Mar. 29, 1998),564-571.

Gilfeather, P. et al., "Fragmentation and High Performance IP", *Parellel abd distributed processing symposium*, ISSN:0-7695-0990-8,(Apr. 23, 2001), 1690-1697.

Chandramenon, G. P., et al., "Reconsidering Fragmentation and Reassembly", *proceedings of the 17th Annual ACM symposium on priciples of distributed computing*, (Jun. 28, 1998),21-29.

Albanesi, M. G., et al., "A VLSI 128-Processor Chip for Multiresolution Image Processing", *Proceedings of the First International Conference on Ischia*, (May 2, 1994),296-307.

Zhang, et al., "Interconnect Architecture Exploration for Low-Energy Reconfigurable Single-Chip DSPs", *VLSI, 99, Proceedings, IEEE Computer Society Workshop on Orlando, FL*, (Apr. 8, 1999),2-8.

Marescaux, T. et al., "Networks on Chip as Hardware Components of an OS for Reconfigurable Systems", *Field-Programmable Logic and Applications, 13th International Conference*, vol. 2778, (2003),595-605.

Blume, H. et al., "Model-based Exploration of the Design Space for Heterogeneous System on Chip", *Proceedings of the IEEE International Conference on Application-Specific Systems, Architectures and Processors*, 2002., XP010601457,(Jul. 17, 2002), 29-40.

Sciuto, D. et al., "Metrics for Design Space Exploration of Heterogeneous Multiprocessor embedded Systems", *Proceedings of the 10th International Workshop on Hardware/Software Codesign*, XP002317354,(May 6, 2002),55-60.

Parameswaram, S. et al., "Profiling in the ASP Codesign Environment", *Journal of Systems Architcture, Elsevier Science Publishers BV*, 46(14), XP004224625,(Dec. 1, 2000),1263-1274.

Ahmadinia, A. et al., "Temporal Task Clustering for Online Placement on Reconfigurable Hardware", *Field-Programmable Technology (FPT), 2003. Proceedings IEEE International Conference*, XP010688364,(Dec. 15, 2003),359-362.

*International Search Report and Written Opinion of the International Searching Authority*; Dated Dec. 6, 2005; PCT/US2005/010387, 16 pgs.

Benini, L. et al.,"System-Level Power Optimization: Techniques and Tools", *ACM Transactions on Design Automation of Electronic Systems*, 5(2), (Apr. 2000),115-192.

\* cited by examiner

ALLOCATION OF COMBINED OR SEPARATE DATA AND CONTROL PLANES

This application is a divisional of prior application Ser. No. 10/789,187, filed Feb. 27, 2004, now U.S. Pat. No. 7,424,698 B2 to Honary, which is hereby incorporated herein by reference.

FIELD

The present invention relates generally to reconfigurable circuits, and more specifically to programming reconfigurable circuits.

BACKGROUND

Some integrated circuits are programmable or configurable. Examples include microprocessors and field programmable gate arrays. As programmable and configurable integrated circuits become more complex, the tasks of programming and configuring them also become more complex.

DESCRIPTION OF EMBODIMENTS

Figure 1:
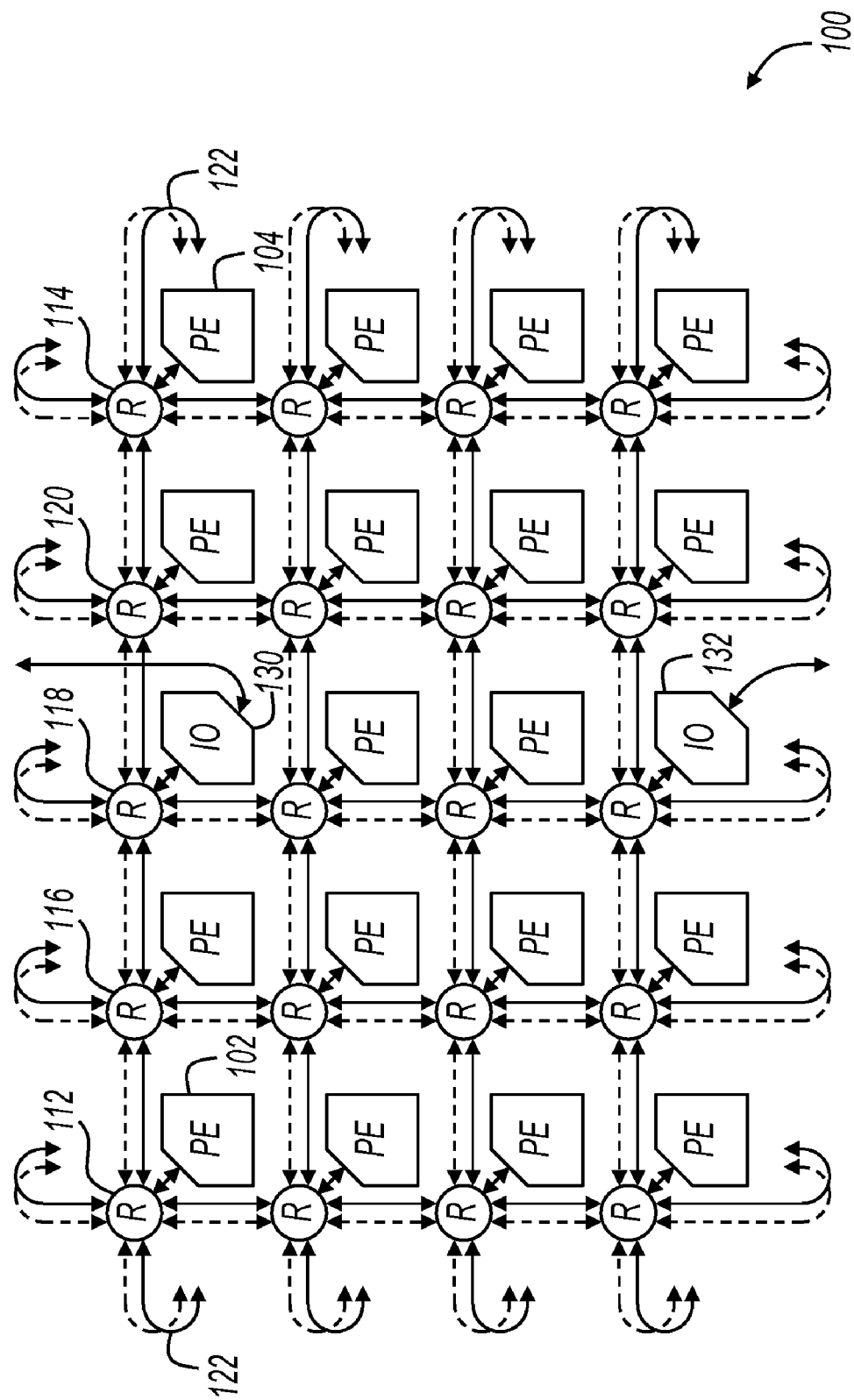
FIG. 1 shows a block diagram of a reconfigurable circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a block diagram of a reconfigurable circuit. Reconfigurable circuit 100 includes a plurality of processing elements (PEs) and a plurality of interconnected routers (Rs). In some embodiments, each PE is coupled to a single router, and the routers are coupled together in toroidal arrangements. For example, as shown in FIG. 1, PE 102 is coupled to router 112, and PE 104 is coupled to router 114. Also for example, as shown in FIG. 1, routers 112 and 114 are coupled together through routers 116, 118, and 120, and are also coupled together directly by interconnect 122 (shown at left of R 112 and at right of R 114). The various routers (and PEs) in reconfigurable circuit 100 are arranged in rows and columns with nearest-neighbor interconnects, such that each row of routers is interconnected as a toroid, and each column of routers is interconnected as a toroid. In some embodiments, each router is coupled to a single PE, and in other embodiments, each router is coupled to more than one PE.

In some embodiments of the present invention, configurable circuit 100 may have a "heterogeneous architecture" that includes various different types of PEs. For example, PE 102 may include a programmable logic array that may be configured to perform a particular logic function, while PE 104 may include a processor core that may be programmed with machine instructions. In some embodiments, some PEs may implement various types of "micro-coded accelerators" (MCAs). MCAs may be employed to accelerate particular functions, such as filtering data, performing digital signal processing (DSP) tasks, or convolutional encoding or decoding. In general, any number of PEs with a wide variety of architectures may be included within configurable circuit 100.

As shown in FIG. 1, PEs are connected by a dual mesh interconnect network. The dual mesh interconnect network includes a first mesh, or "plane," (shown with solid arrows between PEs) and a second mesh, or "plane," (shown with dashed arrows between PEs). In some embodiments, the first mesh is utilized for data communications between PEs, and the second mesh is utilized for control communications between PEs. In other embodiments, one or both of the planes in the dual mesh interconnect network is shared between control and data. For example, in some embodiments, control and data planes may be combined on the same mesh in part because the protocol by which data is communicated over the network may support in-band signaling. Alternatively, the control plane can be separated from the data plane, and serve as a dedicated Control and Configuration Mesh (CCM). As described further below, dynamic allocation of the dual mesh interconnect between control and data may be performed. Dynamic allocation may be performed by a processing element within configurable circuit 100, or dynamic allocation may be performed by a processor external to configurable circuit 100.

In some embodiments, the routers communicate with each other and with PEs using packets of information. For example, if PE 102 has information to be sent to PE 104, it may send a packet of data to router 112, which routes the packet to router 114 for delivery to PE 104. Packets may include control information or data, and may be of any size. In some embodiments, data packets are routed between PEs using one plane of the dual mesh interconnect network, and control packets are routed between PEs using a separate plane. In other embodiments, data packets and control packets are routed between PEs on the same plane. In some embodiments, PEs are programmable in a manner that allows the dynamic allocation of the mesh between data and control. By programming or configuring a PE, the mesh may be allocated or re-allocated between data and control.

As shown in FIG. 1, configurable circuit 100 includes input/output (IO) elements 130 and 132. Input/output elements 130 and 132 may be used by configurable circuit 100 to communicate with other circuits. For example, IO element 130 may be used to communicate with a host processor, and IO element 132 may be used to communicate with an analog front end, such as a radio frequency (RF) receiver or transmitter. Any number of IO elements may be included in configurable circuit 100, and their architectures may vary widely. Like PEs, IOs may be configurable or programmable, and may have differing levels of configurability based on their underlying architectures.

Configurable circuit 100 may be configured by receiving configuration packets through an IO element. For example, IO element 130 may receive configuration packets that include configuration information for various PEs and IOs, and the configuration packets may be routed to the appropriate elements. Configurable circuit 100 may also be configured by receiving configuration information through a dedicated programming interface. For example, a serial interface, such as a serial-scan chain, may be utilized to program configurable circuit 100.

Configuration packets received by configurable circuit 100 may include allocation information for the dual mesh interconnect network. For example, in some embodiments, configuration packets may include PE programming information to allocate one plane of the dual mesh interconnect network to data communication, and the other plane to control communication. In other embodiments, configuration packets may include PE programming information to allocate one or both planes to be shared between data and control communication.

In some embodiments, a PE or IO within configurable circuit 100 may serve as a processing element that receives configuration packets and allocates resources in the dual mesh interconnect network. For example, IO 130 may include a processor that serves as a host interface node. The host interface node may receive configuration packets and allocate resources within the dual mesh interconnect network by programming the various elements within configurable circuit 100.

Various method embodiments of the present invention may be performed by a processing element within configurable circuit 100. For example, various methods described below with reference to FIG. 4 may be performed by a processor within configurable circuit 100.

Configurable circuit 100 may have many uses. For example, configurable circuit 100 may be configured to instantiate particular physical layer (PHY) implementations in communications systems, or to instantiate particular media access control layer (MAC) implementations in communications systems. For example, configurable circuit 100 may be configured to operate in compliance with a wireless network standard, such as ANSI/IEEE Std. 802.11, 1999 Edition, although this is not a limitation of the present invention. As used herein, the term "802.11" refers to any past, present, or future IEEE 802.1 1 standard, including, but not limited to, the 1999 edition.

Various PHY and MAC configurations may benefit from combined data and control planes. For example, applications with high-bandwidth data requirements and more flexible latency constraints may use both mesh networks for data and control to improve the overall bandwidth. Examples of PHY implementations that may benefit from combined data and control planes include wideband code division multiple access (WCDMA) base-station PHYs, which may have relatively loose latency constraints, but receive data coming in from multiple antennas. WCDMA is cited as an example, and the invention is not limited in this respect.

Various PHY and MAC configurations may benefit from separate data and control planes. For example, applications with tight latency constraints may benefit from separate data and control planes, allowing for regular deterministic data flow. Examples of PHY implementations with tight latency requirements may include orthogonal frequency division multiplexing (OFDM) implementations operating in compliance with an IEEE 802.11 standard. Also, for example, applications with high control overhead or with the ability for a quick re-configuration may benefit from separate mesh structures for control and data. A separate control and configuration mesh (CCM) network may allow elements to be re-configured without impacting the normal network data traffic. In addition, it may allow time-critical control functions to be transmitted directly to each element.

In some embodiments, multiple configurations for configurable circuit 100 may exist, and changing from one configuration to another may allow a communications system to quickly switch from one PHY to another, one MAC to another, or between any combination of multiple configurations. Further, the various configurations may utilize the dual mesh interconnect network differently. In some embodiments, when switching from one configuration to another, the dual mesh interconnect network may be re-allocated between data and control. Further, in some embodiments, the dual mesh interconnect network may be re-allocated without completely changing a configuration.

In some embodiments, configurable circuit 100 is part of an integrated circuit. In some of these embodiments, configurable circuit 100 is included on an integrated circuit die that includes circuitry other than configurable circuit 100. For example, configurable circuit 100 may be included on an integrated-circuit die with a processor, memory, or any other suitable circuit. In some embodiments, configurable circuit 100 coexists with radio frequency (RF) circuits on the same integrated-circuit die to increase the level of integration of a communications device. Further, in some embodiments, configurable circuit 100 spans multiple integrated-circuit dice.

Figure 2:
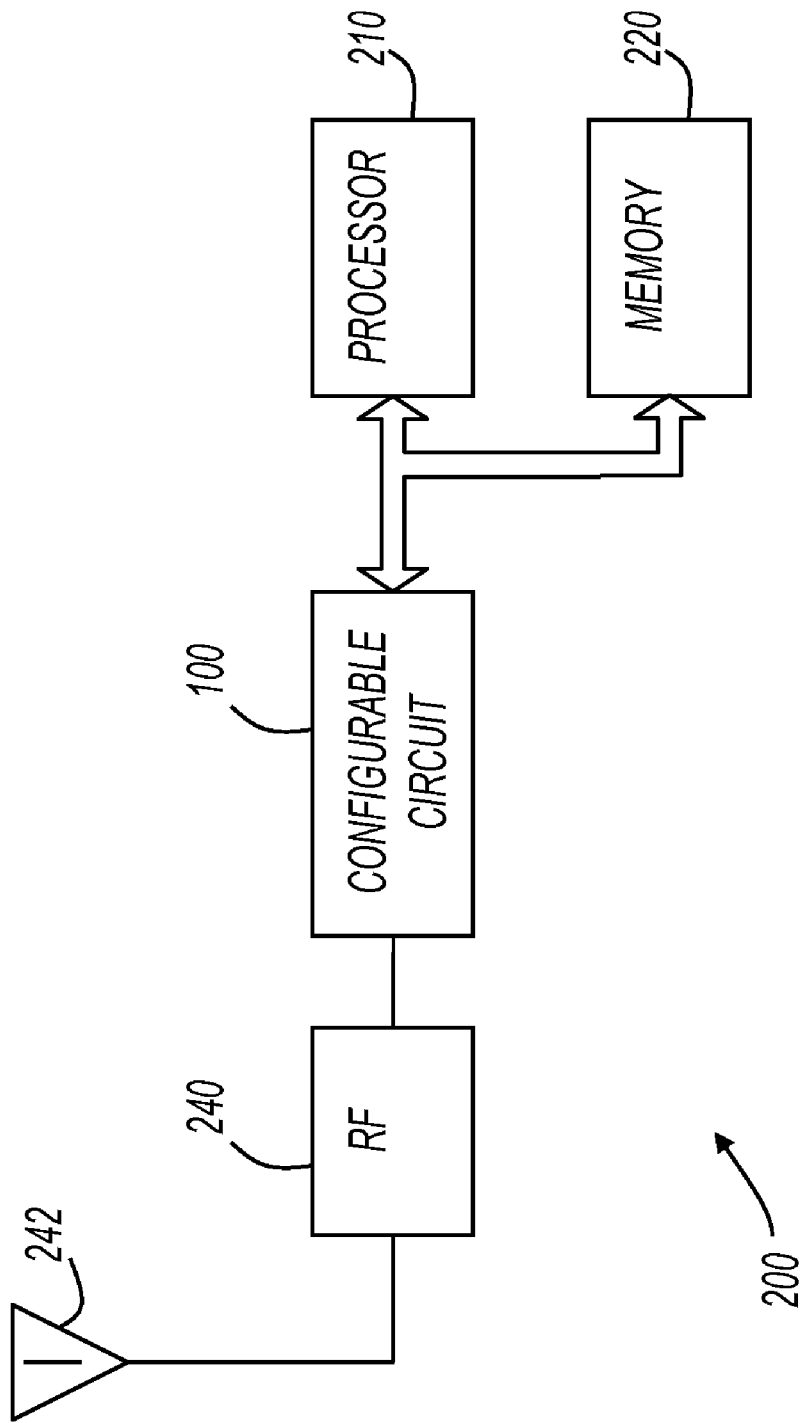
FIG. 2 shows a diagram of an electronic system in accordance with various embodiments of the present invention.

FIG. 2 shows a block diagram of an electronic system. System 200 includes processor 210, memory 220, configurable circuit 100, RF interface 240, and antenna 242. In some embodiments, system 200 may be a computer system to develop configurations for use in configurable circuit 100. For example, system 200 may be a personal computer, a workstation, a dedicated development station, or any other computing device capable of creating a configuration for configurable circuit 100. In other embodiments, system 200 may be an "end-use" system that utilizes configurable circuit 100 after it has been programmed with a particular configuration. Further, in some embodiments, system 200 may be a system capable of developing configurations as well as using them.

In some embodiments, processor 210 may be a processor that can perform methods described below with reference to FIGS. 3 and 4. For example, processor 210 may perform methods that transform design descriptions into configurations for configurable circuit 100, and processor 210 may also perform methods to configure configurable circuit 100. Configurations for configurable circuit 100 may be stored in memory 220, and processor 210 may read the configurations from memory 220 when configuring configurable circuit 100. Further, when transforming design descriptions into configurations for configurable circuit 100, processor 210 may store one or more configurations in memory 220. Processor 310 represents any type of processor, including but not limited to, a microprocessor, a microcontroller, a digital signal processor, a personal computer, a workstation, or the like.

In some embodiments, system 200 may be a communications system, and processor 210 may be a computing device that performs various tasks within the communications system. For example, system 200 may be a system that provides wireless networking capabilities to a computer. In these embodiments, processor 210 may implement all or a portion of a device driver, or may implement all or part of a MAC. Also in these embodiments, configurable circuit 100 may implement one or more protocols for wireless network connectivity. In some embodiments, configurable circuit 100 may implement multiple protocols simultaneously, and in other embodiments, processor 210 may change the protocol in use by reconfiguring configurable circuit 100. Further, processor 210 may change the behavior of a protocol in use by reconfiguring a portion of configurable circuit 100.

Memory 220 represents an article that includes a machine-readable medium. For example, memory 220 represents any one or more of the following: a hard disk, a floppy disk, random access memory (RAM), dynamic random access memory (DRAM), static random access memory (SRAM), read only memory (ROM), flash memory, CDROM, or any other type of article that includes a medium readable by a machine, such as processor 210. In some embodiments, memory 220 can store instructions for performing the execution of the various method embodiments of the present invention. Also in some embodiments, memory 220 can store one or more configurations for configurable circuit 100.

In operation of some embodiments, processor 210 reads instructions and data from memory 220 and performs actions in response thereto. For example, various method embodiments of the present invention may be performed by processor 210 while reading instructions from memory 220.

Antenna 242 may be either a directional antenna or an omni-directional antenna. For example, in some embodiments, antenna 242 may be an omnidirectional antenna such as a dipole antenna, or a quarter-wave antenna. Also, for example, in some embodiments, antenna 242 may be a directional antenna, such as a parabolic dish antenna or a Yagi antenna. In some embodiments, antenna 242 is omitted, and in other embodiments, antenna 242 includes multiple antennas or multiple antenna elements.

In some embodiments, RF signals transmitted or received by antenna 242 may correspond to voice signals, data signals, or any combination thereof. For example, in some embodiments, configurable circuit 100 may implement a protocol for a wireless local area network interface, cellular phone interface, global positioning system (GPS) interface, or the like. In these various embodiments, RF interface 240 may operate at the appropriate frequency for the protocol implemented by configurable circuit 100. RF interface 240 may include any suitable components, including amplifiers, filters, mixers, and the like. In some embodiments, RF interface 240 is omitted.

Figure 3:
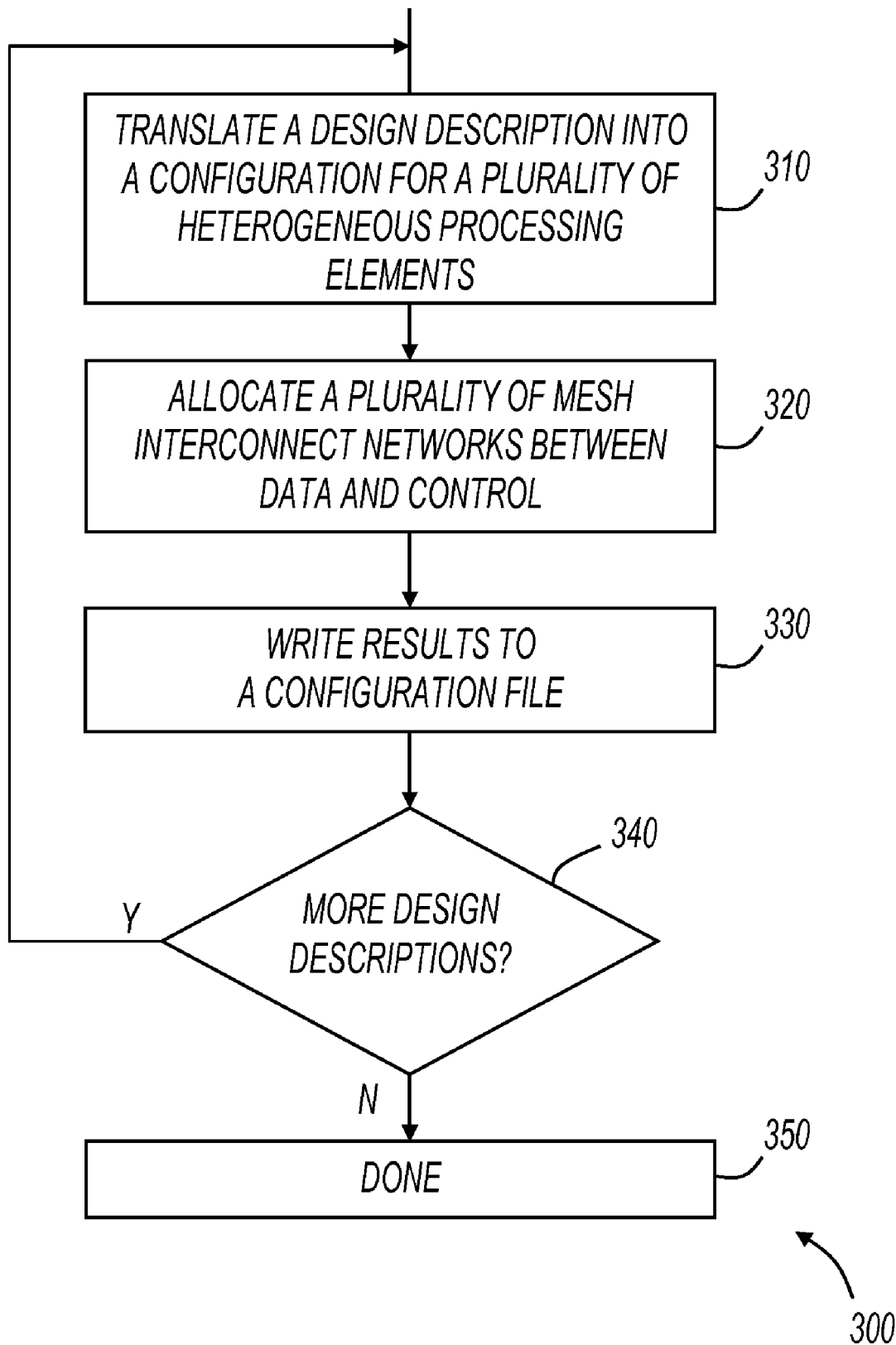
FIGS. 3 and 4 show flowcharts in accordance with various embodiments of the present invention.

FIG. 3 shows a flowchart in accordance with various embodiments of the present invention. In some embodiments, method 300, or portions thereof, is performed by an electronic system, or an electronic system in conjunction with actions of a person. In other embodiments, all or a portion of method 300 is performed by a control circuit or processor, embodiments of which are shown in the various figures. Method 300 is not limited by the particular type of apparatus, software element, or person performing the method. The various actions in method 300 may be performed in the order presented, or may be performed in a different order. Further, in some embodiments, some actions listed in FIG. 3 are omitted from method 300.

Method 300 is shown beginning with block 310 in which a design description is translated into configurations for a plurality of heterogeneous processing elements (PEs). For example, a design description representing a final configuration for a configurable circuit, such as configurable circuit 100 (FIGS. 1, 2), may be translated into configurations for PEs, such as those shown in FIG. 1. In some embodiments, translating a design description may include many operations. For example, a design description may be in a high-level language, and translating the design description may include partitioning, parsing, grouping, placement, and the like. In other embodiments, translating a design description may include few operations. For example, a design description may be represented using an intermediate representation, and translating the design description may include generating code for the various PEs.

In some embodiments, a configuration specified by the design description in block 310 may be in the form of an algorithm that a particular PHY, MAC, or combination thereof, is to implement. The algorithm may be in the form of a procedural or object-oriented language, such as C or C++, or may be written in a specialized, or "stylized" version of a high-level language.

In some embodiments, constraints may be specified to guide the translation of a design description. Constraints may include minimum requirements that the completed configuration should meet, such as latency and throughput constraints. In some embodiments, various constraints are assigned weights so that they are given various amounts of deference during the translation of the design description. In some embodiments, constraints may be listed as requirements or preferences, and in some embodiments, constraints may be listed as ranges of parameter values. In some embodiments, constraints may not be absolute. For example, if the target reconfigurable circuit includes a data path that communicates with packets, the measured latency through part of the design may not be a fixed value but instead may be one with a statistical variation.

At 320, a plurality of mesh interconnect networks are allocated between data and control. In this context, "allocating" refers to determining which portion of a mesh interconnect network within a configurable circuit is to be used for control information, and which portion is to be used for data information. As described above, separate meshes may be allocated to provide for separate data and control planes, or one or more meshes may be allocated to provide for combined data and control planes.

In some embodiments, one result of "allocating" includes the generation of configuration information for PEs. For example, a PE may, in general, send or receive data or control information on either or both of the mesh interconnects shown in FIG. 1. By generating configuration information for a PE, method 300 may determine the PE's behavior with respect to mesh interconnect usage.

Method 300 may measure a "quality" of the configuration, and repeat all or portions of the actions listed in blocks 310 or 320. For example, the quality of the current configuration may be measured by a "profiler" implemented in hardware or software. In some embodiments, a profiler may allow the gathering of information that may be compared against constraints to determine the quality of the current configuration. For example, a profiler may be utilized to determine whether latency or throughput requirements can be met by the current configuration. If constraints are not met, or if the margin by which they are met is undesirable, portions of blocks 310 or 320 may be repeated. For example, a design may be placed or routed differently, or the mesh interconnect may be allocated differently, or any combination of changes may be made to the configuration. Evaluation may include evaluating a cost function that takes into account many possible parameters, including constraints.

A completed configuration is output from 320 when the constraints are met. In some embodiments, the completed configuration is in the form of a file that specifies the configuration of a configurable circuit such as configurable circuit 100 (FIG. 1). In some embodiments, the completed configuration is in the form of configuration packets to be loaded into a configurable circuit such as configurable circuit 100. The form taken by the completed configuration is not a limitation of the present invention.

At 330 of method 300, a configuration file is written. In some embodiments, the file may include configuration information for PEs, including information governing the allocation of one or more mesh interconnect networks. If more than one design description is to be translated, then block 340 causes method 300 to translate another design. Otherwise, method 300 ends at 350.

At the completion of method 300, one or more configuration files exist, where each configuration file specifies a configuration for a configurable circuit. Each configuration may allocate the dual mesh interconnect network differently. For example, one configuration file may have separate control and data planes, and another protocol file may have combined control and data planes.

Figure 4:
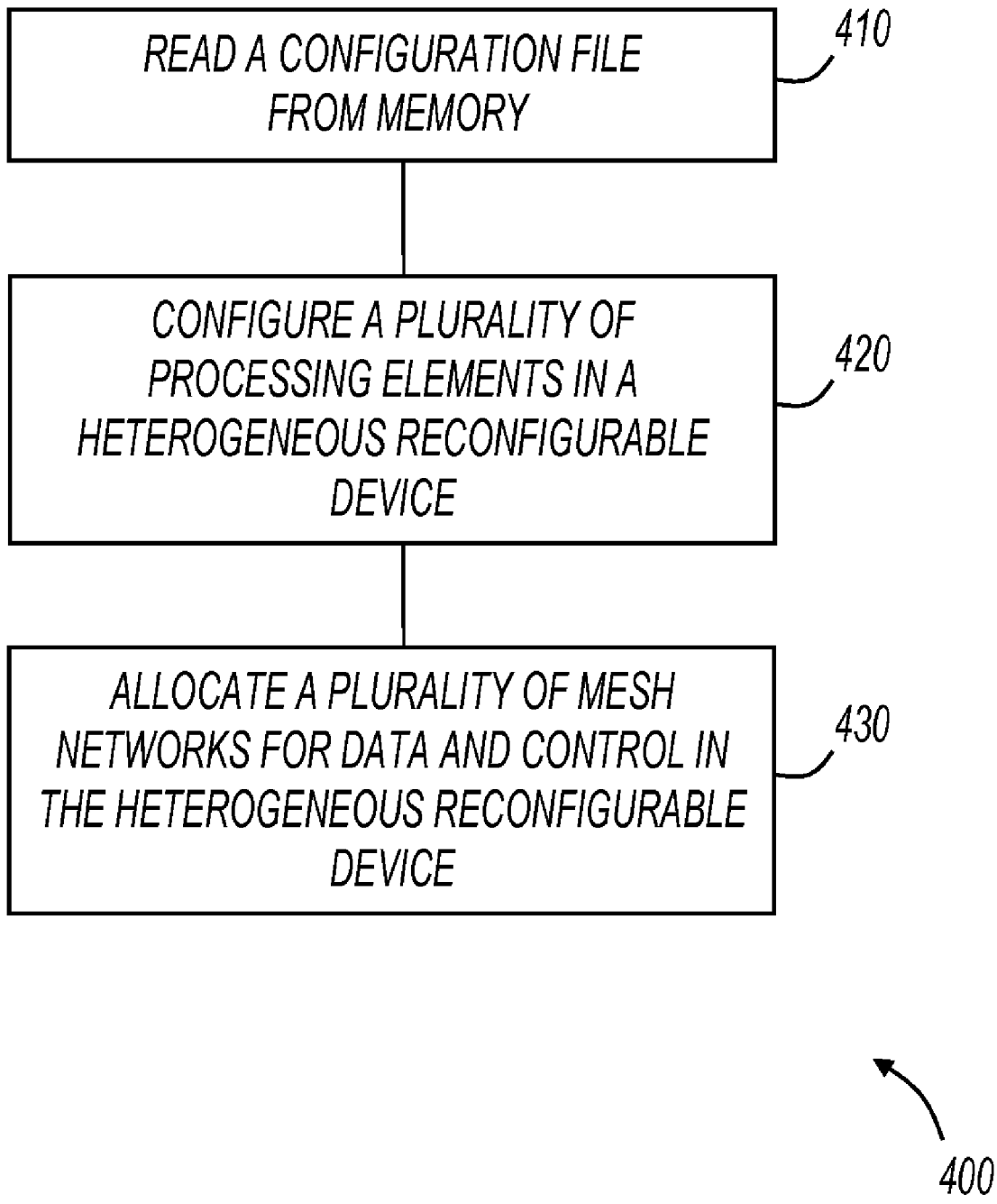

FIG. 4 shows a flowchart in accordance with various embodiments of the present invention. In some embodiments, method 400, or portions thereof, is performed by an electronic system, a control circuit, a processor, a configurable circuit, or a processing element (PE), embodiments of which are shown in the various figures. Method 400 is not limited by the particular type of apparatus or software element performing the method. The various actions in method 400 may be performed in the order presented, or may be performed in a different order. Further, in some embodiments, some actions listed in FIG. 4 are omitted from method 400.

Method 400 is shown beginning with block 410 in which a configuration file is read from memory. A configuration file may be read by a processor in an electronic system, or may be read by an element within a configurable circuit. For example, a processor, such as processor 210 (FIG. 2), may read a configuration file, or a processing element or input/output element, such as IO 130 (FIG. 1), may read a configuration file. The memory may be memory within an electronic system, such as system 200 (FIG. 2), or may be memory dedicated within a configurable circuit.

At 420, a plurality of processing elements in a heterogeneous reconfigurable device is configured. In some embodiments, this corresponds to a processor in an electronic system sending configuration packets to a configurable circuit such, as configurable circuit 100 (FIGS. 1, 2). In other embodiments, this corresponds to an element within a configurable circuit receiving configuration information and distributing it to appropriate processing elements.

In some embodiments, only a portion of a heterogeneous reconfigurable device is configured at 420. For example, a reconfigurable device may implement multiple wireless network protocols simultaneously, and less than all of the multiple protocols may be changed while others remain. When configuring a device in this manner, configuration information may be sent across a dedicated control mesh within the reconfigurable device without disturbing data traffic. By having separate data and control planes, actions in block 420 may be performed without adverse impacts on data bandwidth. Also in some embodiments, configuration information may be sent to a portion of a heterogeneous reconfigurable device using combined data and control planes. In these embodiments, control information may utilize bandwidth that would otherwise be available to data traffic.

At 430, a plurality of mesh networks are allocated for data and control in the heterogeneous reconfigurable device. In this context, "allocating" refers to sending configuration information to PEs to affect their behavior with respect to the use of the mesh interconnect. For example, if a configuration file includes configuration information for configuring separate data and control planes, various processing elements may be configured in a manner that allocates one mesh for control communications and another mesh for data communications.

Also, for example, if a configuration file includes configuration information for configuring shared data and control planes, various processing elements may be configured in a manner that allocates one or more meshes to be shared for data and control communications.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit, comprising:
a heterogeneous network of processing elements, at least one of the processing elements being capable of receiving a radio-frequency signal;
first and second mesh interconnect networks coupled to the heterogeneous network of processing elements, the first mesh interconnect network being coupled together in a toroidal arrangement, and the second mesh interconnect network being coupled together in a toroidal arrangement, the integrated circuit being programmable to utilize the first and second mesh interconnect networks for any combination of data and control, each respective mesh interconnect network comprising an arrangement of rows and columns, each row of the mesh interconnect network being coupled in a toroidal arrangement, and each column of the mesh interconnect network being coupled in a toroidal arrangement; and
a processor to configure the plurality of processing elements.

2. The integrated circuit of claim 1, further comprising a processor to dynamically allocate the first mesh interconnect network for data communications and the second mesh interconnect network for control communications.

3. The integrated circuit of claim 2, wherein the heterogeneous network of processing elements is configurable to utilize the first mesh interconnect network for data communication and the second mesh network for both data and control communication.

4. The integrated circuit of claim 2, wherein the heterogeneous network of processing elements is configurable to utilize both the first and second mesh interconnect networks to share data and control communication.

5. An apparatus, comprising:
a dual mesh interconnect network, each respective mesh interconnect network of the dual mesh interconnect network being coupled together in a toroidal arrangement, the first mesh interconnect network comprising an arrangement of rows and columns, each row of the first mesh interconnect network being coupled in a toroidal arrangement, and each column of the first mesh interconnect network being coupled in a toroidal arrangement, and the second mesh interconnect network comprising an arrangement of rows and columns, each row of the second mesh interconnect network being coupled in a toroidal arrangement, and each column of the second mesh interconnect network being coupled in a toroidal arrangement;
a plurality of processing elements coupled to the dual mesh interconnect network, wherein the plurality of processing elements are configurable to utilize the dual mesh interconnect network for any combination of data and control, and at least one of the processing elements is capable of receiving a radio-frequency signal; and a processor to configure the plurality of processing elements.

6. The apparatus of claim 5, further comprising a plurality of routers coupled between the dual mesh interconnect network and the plurality of processing elements.

7. The apparatus of claim 5, wherein the dual mesh interconnect network includes a first plane and a second plane, and the plurality of processing elements are configurable to utilize the first plane for data communication and the second plane for control communication.

8. The apparatus of claim 7, wherein the plurality of processing elements are configurable to utilize both the first and second planes to share data and control communication.

9. A heterogeneous reconfigurable integrated circuit, comprising:
   a plurality of processing elements, at least one of the processing elements being capable of receiving a radio-frequency signal;
   a first mesh interconnect network coupling the plurality of processing elements, the first mesh interconnect network capable of carrying control and data communications, the first mesh interconnect network being coupled together in a toroidal arrangement, the first mesh interconnect network comprising an arrangement of rows and columns, each row of the first mesh interconnect network being coupled in a toroidal arrangement, and each column of the first mesh interconnect network being coupled in a toroidal arrangement;
   a second mesh interconnect network coupling the plurality of processing elements, the second mesh interconnect network capable of carrying control and data communications, the second mesh interconnect network being coupled together in a toroidal arrangement, the second mesh interconnect network comprising an arrangement of rows and columns, each row of the second mesh interconnect network being coupled in a toroidal arrangement, and each column of the second mesh interconnect network being coupled in a toroidal arrangement; and
   a processor to configure the plurality of processing elements.

10. The hetereogenous reconfigurable integrated circuit of claim 9, wherein the plurality of processing elements comprise programmable elements of different architectures.

11. The heterogeneous reconfigurable integrated circuit of claim 10, wherein at least one of the plurality of processing elements is configurable to execute software.

12. The heterogeneous reconfigurable integrated circuit of claim 9, further comprising routers coupled between the plurality of processing elements and the first and second mesh interconnect networks.

* * * * *